United States Patent
Takama

(10) Patent No.: US 10,621,745 B2
(45) Date of Patent: Apr. 14, 2020

(54) COMPONENT MOUNTING DEVICE AND COMPONENT MOUNTING METHOD

(71) Applicant: YAMAHA HATSUDOKI KABUSHIKI KAISHA, Iwata-shi, Shizuoka-ken (JP)

(72) Inventor: Kazushi Takama, Iwata (JP)

(73) Assignee: YAMAHA HATSUDOKI KABUSHIKI KAISHA, Shizuoka-ken (JP)

( * ) Notice: Subject to any disclaimer, the term of this patent is extended or adjusted under 35 U.S.C. 154(b) by 185 days.

(21) Appl. No.: 15/573,788

(22) PCT Filed: Jun. 19, 2015

(86) PCT No.: PCT/JP2015/067706
§ 371 (c)(1),
(2) Date: Nov. 13, 2017

(87) PCT Pub. No.: WO2016/203638
PCT Pub. Date: Dec. 22, 2016

(65) Prior Publication Data
US 2018/0153063 A1    May 31, 2018

(51) Int. Cl.
*G06T 7/60* (2017.01)
*H05K 13/08* (2006.01)
*G06T 7/00* (2017.01)

(52) U.S. Cl.
CPC ............ *G06T 7/60* (2013.01); *G06T 7/001* (2013.01); *H05K 13/0815* (2018.08); *G06T 2207/20021* (2013.01); *G06T 2207/30141* (2013.01)

(58) Field of Classification Search
CPC ........... H05K 13/046; H05K 13/0812; H05K 13/0813; H05K 13/0815; G06T 7/001;
(Continued)

(56) References Cited

U.S. PATENT DOCUMENTS

| | | | | |
|---|---|---|---|---|
| 4,980,971 A | * | 1/1991 | Bartschat | H01L 21/681 29/833 |
| 5,084,959 A | * | 2/1992 | Ando | H01L 21/681 29/740 |

(Continued)

FOREIGN PATENT DOCUMENTS

| | | |
|---|---|---|
| CN | 1713811 A | 12/2005 |
| CN | 101166416 A | 4/2008 |

(Continued)

OTHER PUBLICATIONS

An Office Action; "Notification of Reasons for Refusal," issued by the Japanese Patent Office dated Aug. 28, 2018, which corresponds to Japanese Patent Application No. 2017-524257 and is related to U.S. Appl. No. 15/573,788; with English language translation.

(Continued)

*Primary Examiner* — Carl J Arbes
(74) *Attorney, Agent, or Firm* — Studebaker & Brackett PC

(57) ABSTRACT

A component mounting device includes a mounting head that mounts a component at a mounting position on a substrate, an imaging section capable of imaging the mounting position on the substrate, and a controller that determines a mounting state by comparing images of the mounting position before and after mounting of the component captured by the imaging section. The controller is configured to determine the mounting state by comparing the images before and after mounting of the component during operation from completion of mounting of the component to completion of mounting of a subsequent component.

8 Claims, 6 Drawing Sheets

(58) Field of Classification Search
CPC .......... G06T 7/60; G06T 2207/20021; G06T 2207/30141
See application file for complete search history.

(56) References Cited

U.S. PATENT DOCUMENTS

| | | | | |
|---|---|---|---|---|
| 5,566,447 A * | 10/1996 | Sakurai | ............ | H05K 13/0813 29/832 |
| 5,694,219 A * | 12/1997 | Kim | ............ | H05K 13/0812 356/615 |
| 6,041,494 A * | 3/2000 | Mimura | ............ | H05K 13/0452 29/832 |
| 6,144,452 A * | 11/2000 | Hachiya | ............ | G01B 11/14 356/615 |
| 6,317,972 B1 | 11/2001 | Asai et al. | | |
| 6,446,333 B1 * | 9/2002 | Kashiwagi | ......... | H05K 13/0813 29/833 |
| 6,519,838 B1 * | 2/2003 | Okuda | ............ | H05K 13/0409 29/740 |
| 6,535,291 B1 * | 3/2003 | Skunes | ............ | B25J 9/1692 356/614 |
| 6,538,244 B1 * | 3/2003 | Skunes | ............ | H05K 13/0812 250/208.1 |
| 6,580,961 B2 * | 6/2003 | Diggin | ............ | G05B 19/41875 700/121 |
| 6,608,320 B1 * | 8/2003 | Skunes | ............ | G01B 11/024 250/559.19 |
| 6,631,552 B2 * | 10/2003 | Yamaguchi | ......... | H05K 13/0813 29/739 |
| 6,634,091 B1 * | 10/2003 | Hwang | ............ | H05K 13/0813 29/720 |
| 6,931,717 B2 * | 8/2005 | Mizuno | ............ | H05K 13/0812 29/740 |
| 7,065,864 B2 * | 6/2006 | Yamamoto | ......... | H05K 13/0413 29/743 |
| 7,539,339 B2 * | 5/2009 | Tanabe | ............ | G06K 9/32 382/146 |
| 2002/0014003 A1 | 2/2002 | Asai et al. | | |
| 2014/0376003 A1 | 12/2014 | Keränen et al. | | |
| 2018/0153063 A1 | 5/2018 | Takama | | |

FOREIGN PATENT DOCUMENTS

| | | | |
|---|---|---|---|
| CN | 101390456 A | | 3/2009 |
| JP | H04-237200 A | | 8/1992 |
| JP | H04-315905 A | | 11/1992 |
| JP | H05-251897 A | | 9/1993 |
| JP | H06-140799 A | | 5/1994 |
| JP | H08-210820 A | | 8/1996 |
| JP | H11-330798 A | | 11/1999 |
| JP | 2000-031693 A | | 1/2000 |
| JP | 2000-349499 A | | 12/2000 |
| JP | 2002-111299 A | | 4/2002 |
| JP | 2004-327495 A | | 11/2004 |
| JP | 2005-537630 A | | 12/2005 |
| JP | 3848967 | * | 11/2006 |
| JP | 2007-511094 A | | 4/2007 |
| JP | 2007-214212 A | | 8/2007 |
| JP | 2007-214460 A | | 8/2007 |
| JP | 2008-098411 A | | 4/2008 |
| JP | 2008-103426 A | | 5/2008 |
| JP | 2008-516453 A | | 5/2008 |
| JP | 2008-130771 A | | 6/2008 |
| JP | 2010186940 | * | 8/2010 |
| JP | 2012-195508 A | | 10/2012 |
| JP | 2012-255792 A | | 12/2012 |
| JP | 2013-140082 A | | 7/2013 |
| JP | 2014-093390 A | | 5/2014 |
| JP | 2014-216621 A | | 11/2014 |
| JP | 2015-508499 A | | 3/2015 |
| JP | 2015-079933 A | | 4/2015 |
| WO | 2016/203638 A1 | | 12/2016 |

OTHER PUBLICATIONS

An Office Action; "Notification of Reasons for Refusal," issued by the Japanese Patent Office dated Aug. 28, 2018, which corresponds to Japanese Patent Application No. 2017-172125 and is related to U.S. Appl. No. 15/573,788; with English language translation.
An Office Action mailed by the Japanese Patent Office dated Mar. 12, 2019, which corresponds to Japanese Patent Application No. 2017-524257 and is related to U.S. Appl. No. 15/573,788; with English translation.
An Office Action mailed by the State Intellectual Property Office of the People's Republic of China dated Jun. 21, 2019, which corresponds to Chinese Patent Application No. 201580080861.8 and is related to U.S. Appl. No. 15/573,788.
An Office Action mailed by the Japanese Patent Office dated Dec. 4, 2018, which corresponds to Japanese Patent Application No. 2017-172125 and is related to U.S. Appl. No. 15/573,788.
International Search Report issued in PCT/JP2015/067706; dated Sep. 29, 2015.
Written Opinion issued in PCT/JP2015/067706; dated Sep. 29, 2015.
An Office Action mailed by the Japanese Patent Office dated Jun. 12, 2018, which corresponds to Japanese Patent Application No. 2017-172125 and is related to U.S. Appl. No. 15/573,788.
An Office Action; "Notification of Reasons for Refusal," issued by the Korean Patent Office dated Apr. 11, 2019, which corresponds to Korean Patent Application No. 10-2017-7032292 and is related to U.S. Appl. No. 15/573,788; with English language translation.
An Office Action; "Notification of Reasons for Refusal," issued by the Korean Patent Office dated Apr. 11, 2019, which corresponds to Korean Patent Application No. 10-2017-7032346 and is related to U.S. Appl. No. 15/573,788; with English language translation.
An Office Action mailed by the Chinese Patent Office dated Nov. 15, 2019, which corresponds to Chinese Patent Application No. 201580080861.8 and is related to U.S. Appl. No. 15/573,788. Cited references therein or their corresponding references have been previously submitted.
An Office Action mailed by the State Intellectual Property Office of the People's Republic of China dated Jul. 29, 2019, which corresponds to Chinese Patent Application No. 201810044059.9 and is related to U.S. Appl. No. 15/573,788.
An Office Action mailed by the State Intellectual Property Office of the People's Republic of China dated Dec. 25, 2019, which corresponds to Chinese Patent Application No. 201810044059.9 and is related to U.S. Appl. No. 15/573,788.
An Office Action mailed by the Japanese Patent Office dated Feb. 12, 2020, which corresponds to Japanese Patent Application No. 2019-094794 and is related to U.S. Patent Application No. 15/573,788; with English language translation.

* cited by examiner

MEASUREMENT OF SUBSTRATE SURFACE HEIGHT

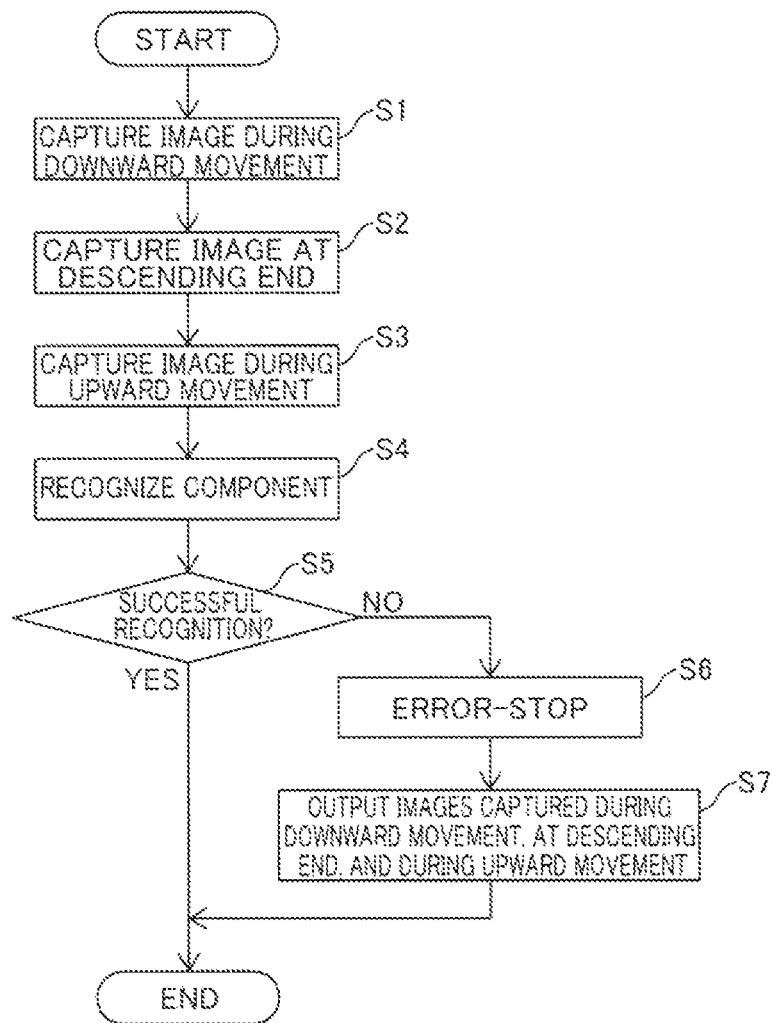

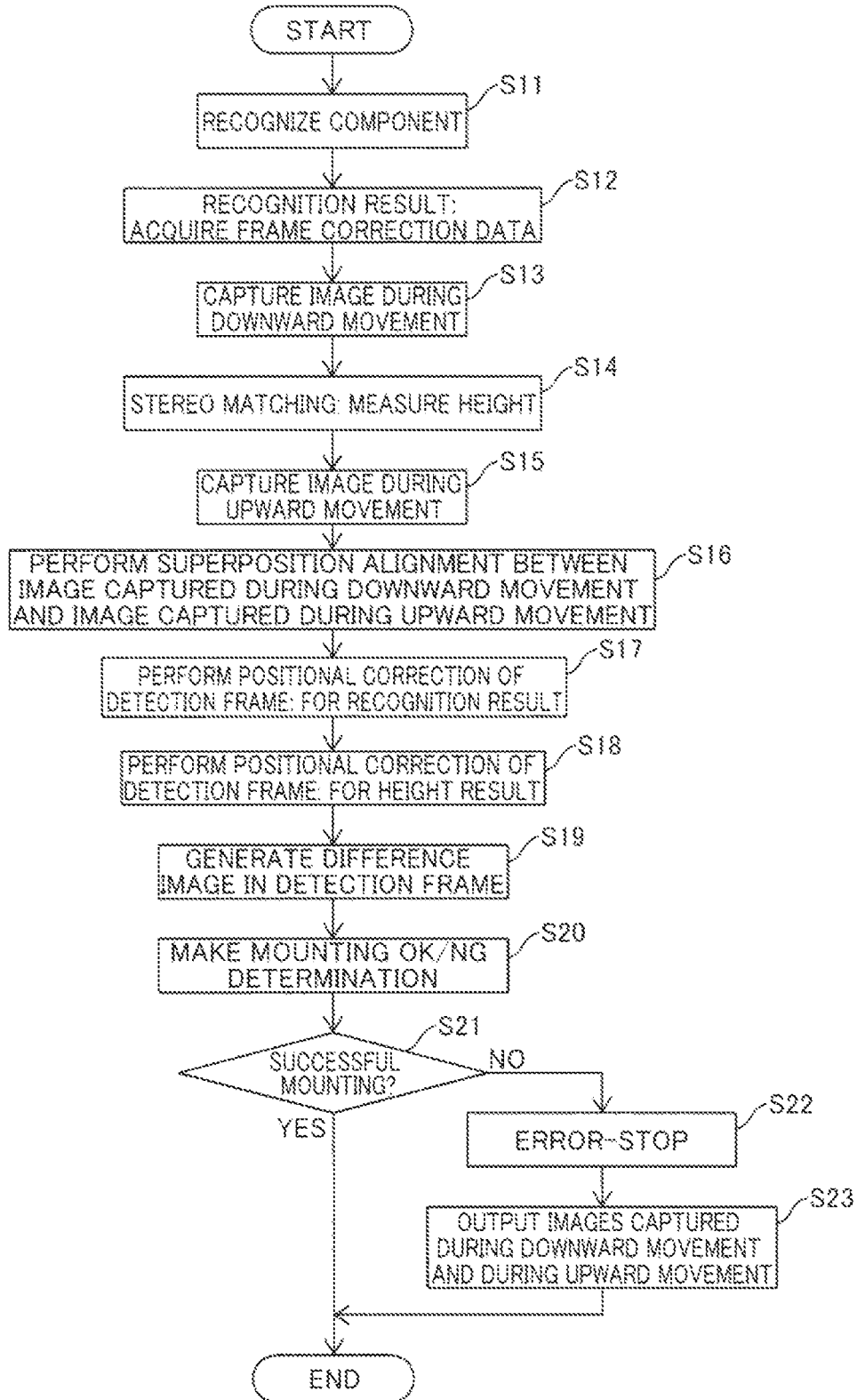

FIG.8 MODIFICATION
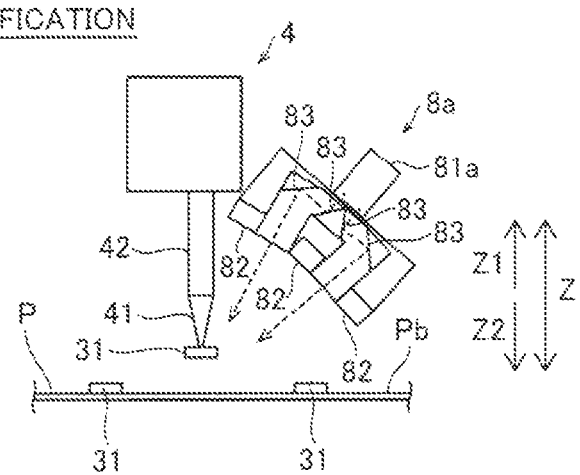

COMPONENT MOUNTING DEVICE AND COMPONENT MOUNTING METHOD

CROSS REFERENCE TO RELATED APPLICATIONS

This application claims benefit of priority to International Patent Application No. PCT/JP2015/067706 filed Jun. 19, 2015, the entire content of which is incorporated herein by reference.

TECHNICAL FIELD

The present disclosure relates to a component mounting device and a component mounting method each capable of imaging the mounting position of a component on a substrate.

BACKGROUND

In general, a component mounting device capable of imaging the mounting position of a component on a substrate is known. Such a component mounting device is disclosed in Japanese Patent Laying-Open No. 2014-93390, for example.

The aforementioned Japanese Patent Laying-Open No. 2014-93390 discloses an electronic component mounting device including a mounting head that mounts electronic components at mounting positions on a substrate and a camera capable of imaging the mounting positions on the substrate. In this electronic component mounting device, all of the electronic components are mounted on the substrate, and thereafter a mounting determination for the electronic components on the substrate is made based on the image captured by the camera.

SUMMARY

Technical Problem

However, in the electronic component mounting device disclosed in the aforementioned Japanese Patent Laying-Open No. 2014-93390, a mounting determination for the electronic components on the substrate is made based on the image captured by the camera after all of the electronic components are mounted on the substrate, and hence even when some of the electronic components are defectively mounted, the defective mounting cannot disadvantageously be detected until all of the electronic components are mounted. Thus, there is such a problem that it is difficult to immediately detect defective mounting.

The present disclosure has been proposed in order to solve the aforementioned problem, and an object of the present disclosure is to provide a component mounting device and a component mounting method each capable of immediately detecting defective mounting of a component on a substrate.

Solution to Problem

A component mounting device according to a first aspect of the present disclosure includes a mounting head that mounts a component at a mounting position on a substrate, an imaging section capable of imaging the mounting position on the substrate, and a controller that determines a mounting state by comparing images of the mounting position before and after mounting of the component captured by the imaging section, and the controller is configured to determine the mounting state by comparing the images before and after mounting of the component during operation from completion of mounting of the component to completion of mounting of a subsequent component.

As hereinabove described, the component mounting device according to the first aspect of the present disclosure is provided with the controller that determines the mounting state by comparing the images before and after mounting of the component during operation from completion of mounting of the component to completion of mounting of the subsequent component. Thus, the mounting state of a precedent component can be determined before completion of mounting of the subsequent component, and hence defective mounting of the component on the substrate can be immediately detected. Consequently, unlike the case where all components are mounted on the substrate, and thereafter the mounting state is determined, a mounting loss of the component due to mounting of a plurality of components on the substrate before detection of defective mounting can be significantly reduced or prevented.

In the aforementioned component mounting device according to the first aspect, the imaging section preferably captures the image before mounting of the component when the mounting head moves down to the mounting position on the substrate before mounting the component and captures the image after mounting of the component when the mounting head moves up from the mounting position on the substrate after mounting the component, and the controller preferably determines the mounting state by comparing the image before mounting and the image after mounting. According to this structure, the image before mounting and the image after mounting captured immediately before and immediately after mounting are compared, and hence it is not necessary to provide a storage for storing image data on the mounting positions of the plurality of components. Furthermore, an image is captured during downward movement of the mounting head and during upward movement of the mounting head, and hence it is possible to prevent the time separately and additionally required for an imaging operation as compared with the case where the downward/upward movement of the mounting head and the imaging operation are separately performed.

In the aforementioned component mounting device according to the first aspect, the controller is preferably configured to acquire information about the height of the substrate at the mounting position from a time point at which the mounting head reaches the mounting position on the substrate after suctioning the component to a time point at which the mounting head completes upward movement from the mounting position on the substrate after mounting the component, and to determine the mounting state by comparing the images before and after mounting of the component using the acquired information about the height of the substrate at the mounting position. According to this structure, the position of the component at the mounting position in the image can be accurately acquired based on the information about the actual height of the mounting position of the component. Consequently, the mounting state of the component on the substrate can be accurately determined. Furthermore, the information about the height of the substrate at the mounting position is acquired before completion of upward movement of the mounting head such that the information about the height of the substrate can be acquired while a loss of time is significantly reduced or prevented.

In the aforementioned structure in which the information about the height of the substrate at the mounting position is acquired, the controller is preferably configured to acquire the information about the height of the substrate at the mounting position using at least one of the images of the mounting position before and after mounting of the component for determining the mounting state. According to this structure, the actual height of the mounting position of the component can be accurately acquired based on at least one of the images before and after mounting of the component.

In this case, the imaging section is preferably configured to be capable of capturing an image from a plurality of directions. According to this structure, the actual height of the mounting position of the component can be easily and accurately acquired based on the image captured from the plurality of directions.

In the aforementioned structure in which the imaging section is capable of capturing an image from the plurality of directions, the imaging section preferably includes a plurality of cameras, or a single camera and an optical system that divides a field of view of the single camera. According to this structure, the mounting position on the substrate can be easily imaged from the plurality of directions by the plurality of cameras, or the single camera and the optical system that divides the field of view of the single camera.

In the aforementioned structure in which the information about the height of the substrate at the mounting position is acquired, the controller is preferably configured to determine mounting determination regions of images for comparing the images before and after mounting of the component in a size that allows determination of whether or not the component is present using the information about the height of the substrate at the mounting position when determining the mounting determination regions. According to this structure, the mounting determination regions can be narrowed down to small regions based on the actual height of the mounting position of the component, and hence erroneous determination due to noise such as blowing away of a surrounding component can be significantly reduced or prevented. Consequently, the mounting state of the component on the substrate can be accurately determined.

In this case, the controller is preferably configured to determine the mounting determination regions such that another component adjacent to the component, the mounting state of which is to be determined, and a substrate feature do not enter the mounting determination regions. According to this structure, erroneous determination due to the influence of another component adjacent to the target component and the substrate feature can be significantly reduced or prevented, and hence a mounting determination for the component on the substrate can be more accurately made.

The aforementioned structure in which the information about the height of the substrate at the mounting position is acquired preferably further includes a suction state imaging section that images a suction state of the component suctioned by the mounting head, and the controller is preferably configured to determine the mounting determination regions based on a suction position of the component imaged by the suction state imaging section in addition to the height of the substrate at the mounting position. According to this structure, the mounting determination regions can be determined based on the suction position of the component in addition to the height of the substrate at the mounting position, and hence the accuracy of mounting determination for the component on the substrate can be further increased.

A component mounting method according to a second aspect of the present disclosure includes mounting a component at a mounting position on a substrate, imaging the mounting position on the substrate before mounting of the component, imaging the mounting position on the substrate after mounting of the component, and determining a mounting state by comparing captured images of the mounting position before and after mounting of the component during operation from completion of mounting of the component to completion of mounting of a subsequent component.

As hereinabove described, the component mounting method according to the second aspect of the present disclosure includes determining the mounting state by comparing the captured images of the mounting position before and after mounting of the component during operation from completion of mounting of the component to completion of mounting of the subsequent component. Thus, the mounting state of a precedent component can be determined before completion of mounting of the subsequent component, and hence the component mounting method capable of immediately detecting defective mounting of the component on the substrate can be provided.

Effect of the Disclosure

According to the present disclosure, as hereinabove described, the component mounting device and the component mounting method each capable of immediately detecting defective mounting of the component on the substrate can be provided.

BRIEF DESCRIPTION OF THE DRAWINGS

FIG. 6 is a flowchart for illustrating control processing during suction operation in the component mounting device according to the embodiment of the present disclosure.

FIG. 7 is a flowchart for illustrating control processing during a mounting operation in the component mounting device according to the embodiment of the present disclosure.

FIG. 8 is a side elevational view of a head unit of a component mounting device according to a modification of the embodiment of the present disclosure.

DETAILED DESCRIPTION

An embodiment embodying the present disclosure is hereinafter described on the basis of the drawings.

Structure of Component Mounting Device

The structure of a component mounting device 100 according to the embodiment of the present disclosure is now described with reference to FIG. 1.

Figure 1:
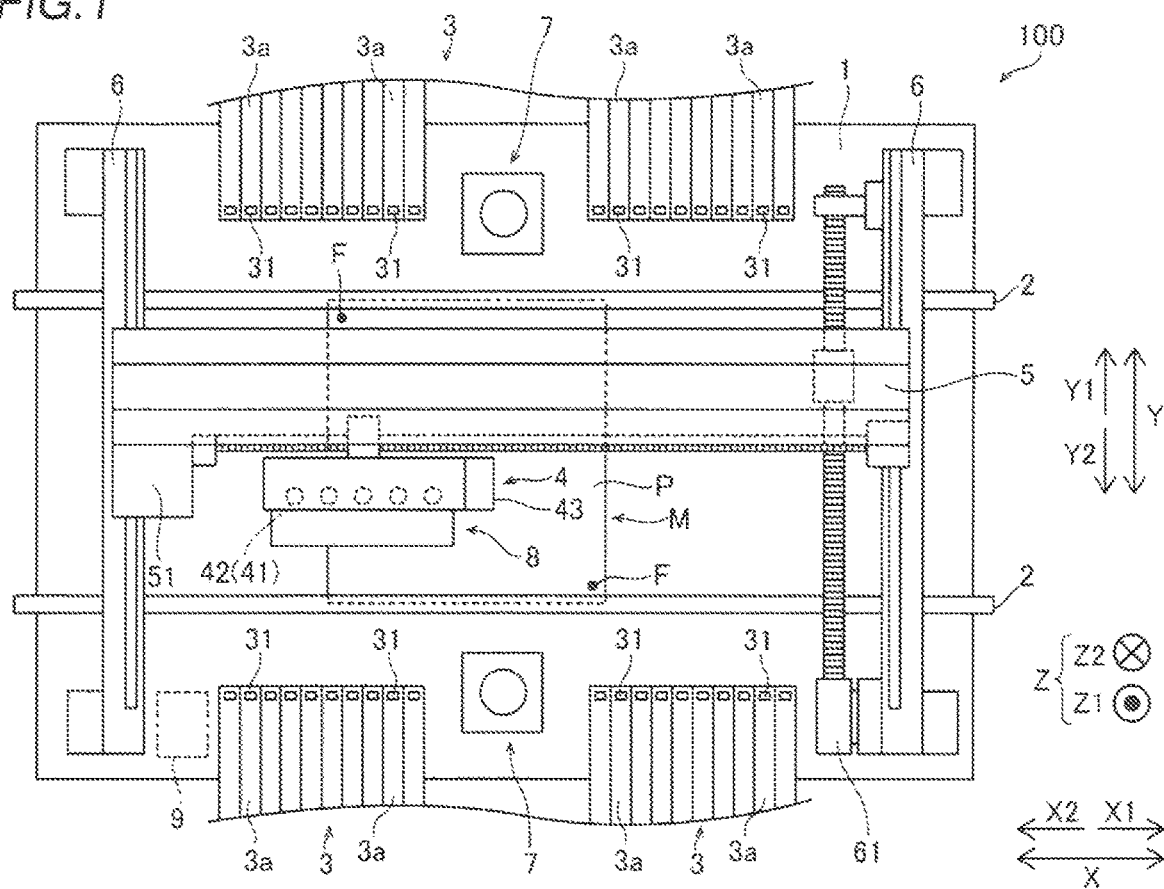
FIG. 1 is a diagram showing the overall structure of a component mounting device according to an embodiment of the present disclosure.

As shown in FIG. 1, the component mounting device 100 is a component mounting device that conveys a substrate P in a direction X by a pair of conveyors 2 and mounts components 31 on the substrate P at a mounting operation position M.

The component mounting device 100 includes a base 1, the pair of conveyors 2, component feeders 3, a head unit 4, a support 5, a pair of rails 6, component recognition imaging sections 7, an imaging unit 8, and a controller 9. The component recognition imaging sections 7 are examples of a "suction state imaging section", and the imaging unit 8 is an example of an "imaging section".

The pair of conveyors 2 are installed on the base 1 and are configured to convey the substrate P in the direction X. In addition, the pair of conveyors 2 are configured to hold the substrate P being conveyed in a stopped state at the mounting operation position M. Moreover, the pair of conveyors 2 are configured such that an interval therebetween in a direction Y can be adjusted according to the dimensions of the substrate P.

The component feeders 3 are disposed outside (Y1 and Y2 sides) of the pair of conveyors 2. A plurality of tape feeders 3a are disposed in the component feeders 3.

The tape feeders 3a hold reels (not shown) on which tapes that hold a plurality of components 31 at a predetermined interval are wound. The tape feeders 3a are configured to feed the components 31 from the tips of the tape feeders 3a by rotating the reels to feed the tapes that hold the components 31. The components 31 include electronic components such as ICs, transistors, capacitors, and resistors.

Figure 2:
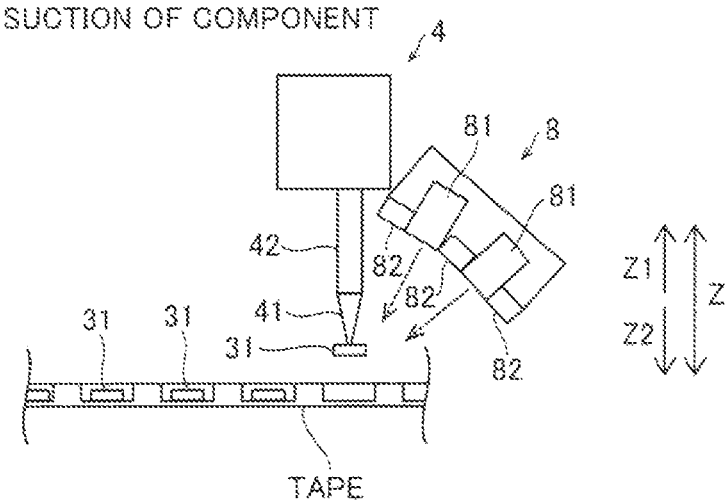
FIG. 2 is a side elevational view of a head unit of the component mounting device according to the embodiment of the present disclosure during suction of a component.

The head unit 4 is disposed above the pair of conveyors 2 and the component feeders 3, and includes a plurality of (five) mounting heads 42 including nozzles 41 (see FIG. 2) mounted at their lower ends and a substrate recognition camera 43.

The mounting heads 42 are configured to be movable up and down (movable in a direction Z), and are configured to suction and hold the components 31 fed from the tape feeders 3a by negative pressure generated at the tips of the nozzles 41 by a negative pressure generator (not shown) and to mount the components 31 at mounting positions (see FIG. 3) on the substrate P.

The substrate recognition camera 43 is configured to image fiducial marks F of the substrate P in order to recognize the position of the substrate P. The positions of the fiducial marks F are imaged and recognized such that the mounting positions of the components 31 on the substrate P can be accurately acquired.

The support 5 includes a motor 51. The support 5 is configured to move the head unit 4 in the direction X along the support 5 by driving the motor 51. Both ends of the support 5 are supported by the pair of rails 6.

The pair of rails 6 are fixed on the base 1. A rail 6 on an X1 side includes a motor 61. The rails 6 are configured to move the support 5 in the direction Y perpendicular to the direction X along the pair of rails 6 by driving the motor 61. The head unit 4 is movable in the direction X along the support 5, and the support 5 is movable in the direction Y along the rails 6 such that the head unit 4 is movable in the directions X and Y.

The component recognition imaging sections 7 are fixed on the upper surface of the base 1. The component recognition imaging sections 7 are disposed outside (Y1 and Y2 sides) of the pair of conveyors 2. The component recognition imaging sections are configured to image the components 31 suctioned by the nozzles 41 of the mounting heads 42 from the lower side (Z2 side) in order to recognize the suction states (suction attitudes) of the components 31 prior to mounting of the components 31. Thus, the controller 9 can acquire the suction states of the components 31 suctioned by the nozzles 41 of the mounting heads 42.

Figure 3:
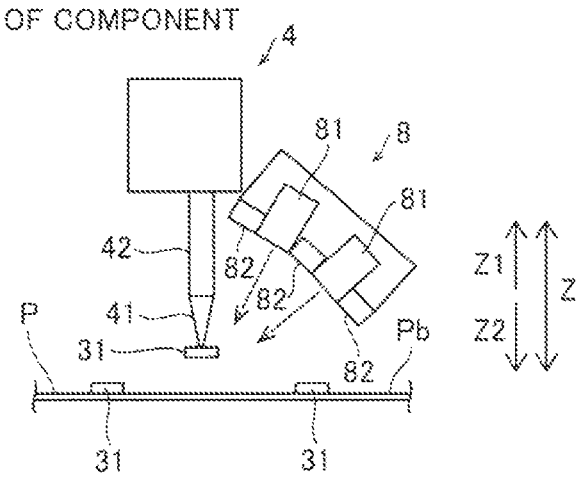
FIG. 3 is a side elevational view of the head unit of the component mounting device according to the embodiment of the present disclosure during mounting of the component.

The imaging unit 8 is mounted on the head unit 4. Thus, the imaging unit 8 is configured to move in the directions X and Y together with the head unit 4 as the head unit 4 moves in the directions X and Y. As shown in FIG. 3, the imaging unit 8 is configured to capture images of a mounting position before and after mounting of a component 31 in order for the controller 9 to make a determination (mounting determination) of whether or not the component 31 has been normally mounted at the mounting position. Furthermore, the imaging unit 8 is configured to capture images for measuring the height of the mounting position on the substrate P. The imaging unit 8 includes a plurality of cameras 81 and illuminators 82. Thus, the imaging unit 8 can image the mounting position on the substrate P from a plurality of directions (angles).

Figure 5:
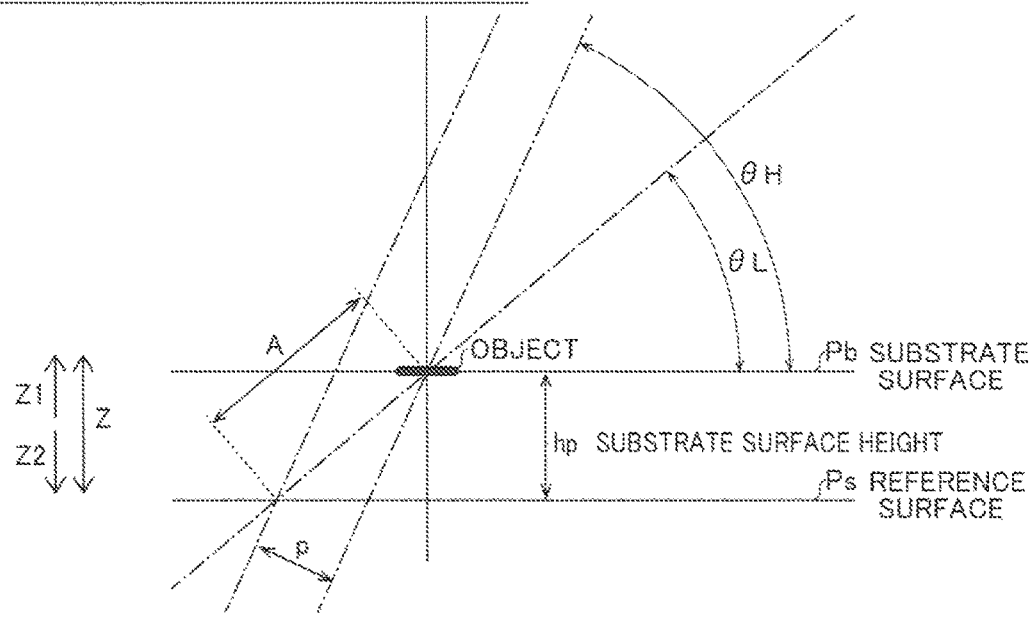
FIG. 5 is a diagram for illustrating a calculation method through stereo matching for a substrate surface height to be calculated for correcting detection frames in the component mounting device according to the embodiment of the present disclosure.

Specifically, the imaging unit 8 is configured to capture images from inclination angles ($\theta H$ and $\theta L$) with different imaging directions from each other with respect to a substrate surface Pb, as shown in FIG. 5. The cameras 81 of the imaging unit 8 are disposed adjacent to each other in a vertical plane (in a YZ plane) including the mounting position with respect to the substrate surface Pb.

The illuminators 82 are configured to emit light when the cameras 81 capture images. The illuminators 82 are provided around the cameras 81. The illuminators 82 each include a light source such as an LED (light-emitting diode).

Figure 4:
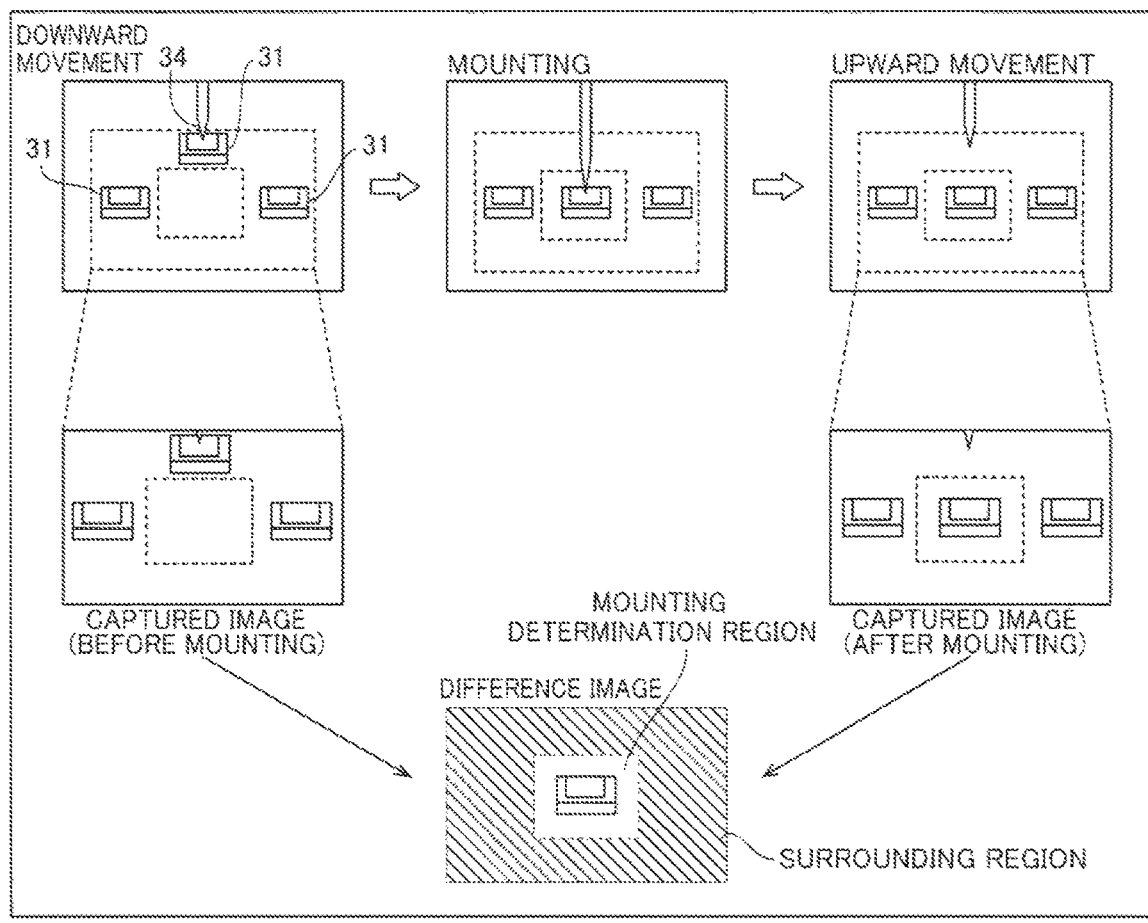
FIG. 4 is a diagram for illustrating mounting determination based on captured images in the component mounting device according to the embodiment of the present disclosure.

As shown in FIG. 4, the imaging unit 8 is configured to image a predetermined region including the mounting position before mounting of the component 31 when a mounting head 42 suctions the component 31 and moves down toward the mounting position before mounting the suctioned component 31 at the mounting position on the substrate P. Furthermore, the imaging unit 8 is configured to image the predetermined region including the mounting position after mounting of the component 31 when the mounting head 42 moves up from the mounting position after mounting the component 31 at the mounting position on the substrate P.

The controller 9 includes a CPU, and is configured to control the overall operation of the component mounting device 100 such as an operation of conveying the substrate P performed by the pair of conveyors 2, a mounting operation performed by the head unit 4, and imaging operations performed by the component recognition imaging sections 7 and the imaging unit 8.

According to this embodiment, the controller 9 is configured to determine the mounting state by comparing the images of the mounting position before and after mounting of the component 31 captured by the imaging unit 8. Specifically, the controller 9 is configured to determine the mounting state by comparing the images before and after mounting of the component 31 during operation from completion of mounting of the component 31 to completion of mounting of a subsequent component 31. It is preferable to determine the mounting state by comparing the images before and after mounting of the component 31 before the subsequent component 31 is suctioned. As shown in FIG. 4, the controller 9 acquires a difference image between the image of the mounting position before mounting of the component 31 and the image of the mounting position after mounting of the component 31. Then, the controller 9 determines whether or not the component 31 has been normally mounted based on the acquired difference image. It should be noted that the controller 9 sets mounting determination regions in images captured using a target component 31 as a reference. Then, the controller 9 acquires a difference image between images of the set mounting determination regions.

The controller 9 is configured to control the imaging unit 8 to capture the image before mounting of the component 31 when the mounting head 42 moves down to the mounting position on the substrate P before mounting the component 31 and capture the image after mounting of the component 31 when the mounting head 42 moves up from the mounting position on the substrate P after mounting the component 31. Furthermore, the controller 9 is configured to determine the mounting state by comparing the image before mounting and the image after mounting.

Specifically, the controller 9 is configured to acquire information about the height of the substrate P at the mounting position from a time point at which the mounting head reaches the mounting position on the substrate P after suctioning the component 31 to a time point at which the mounting head 42 completes upward movement from the mounting position on the substrate P after mounting the component 31. The controller 9 is configured to determine the mounting state by comparing the images before and after mounting of the component using the acquired information about the height of the substrate P at the mounting position. The time until completion of upward movement of the mounting head 42 after mounting of the component 31 includes the time until the mounting head 42 starts to horizontally move after moving up.

That is, according to this embodiment, the controller 9 is configured to acquire the height of the substrate position on the substrate P based on the images captured from the plurality of directions by the imaging unit 8. Specifically, the controller 9 is configured to acquire the height of the substrate surface Pb of the substrate P with respect to a reference surface Ps by stereo matching, as shown in FIG. 5.

An object (a predetermined position on the substrate surface Pb) is imaged at the inclination angle θH by one of the cameras 81, and the object is imaged at the inclination angle θL by the other of the cameras 81. Then, stereo matching between the captured image at the inclination angle θH and the captured image at the inclination angle θL is performed such that a parallax p (pixel) between the two captured images is obtained. Assuming that the camera resolution of the cameras 81 is R (μm/pixel), a distance $\underline{A}$ (μm) can be obtained from an expression (1).

$$A = p \times R / \sin(\theta H - \theta L) \quad (1)$$

Then, the substrate surface height hp (μm) of the substrate surface Pb with respect to the reference surface Ps can be obtained from an expression (2) with the distance $\underline{A}$ obtained from the expression (1).

$$hp = A \times \sin(\theta L) \quad (2)$$

According to this embodiment, the controller 9 is configured to determine the mounting determination regions of images for comparing the images before and after mounting of the component 31 based on the acquired height of the mounting position on the substrate P. The controller 9 shifts the mounting determination regions in a direction (upward direction, for example) in which the mounting position is deviated to set the mounting determination regions in the images when the substrate P is located at a position higher than the reference surface, and shifts the mounting determination regions in another direction (downward direction, for example) in which the mounting position is deviated to set the mounting determination regions in the images when the substrate P is located at a position lower than the reference surface. The controller 9 is configured to acquire the height of the mounting position on the substrate P during a mounting operation and to determine the mounting determination regions based on the acquired height of the mounting position on the substrate P.

Specifically, the controller 9 is configured to acquire the information about the height of the substrate P at the mounting position using at least one of the images of the mounting position before and after mounting of the component 31 for determining the mounting state. The controller 9 is configured to perform control of capturing an image when the mounting head 42 moves down to the mounting position on the substrate P before mounting the component 31 and perform control of capturing an image when the mounting head 42 moves up from the mounting position on the substrate P after mounting the component 31.

The controller 9 is configured to determine the mounting determination regions, each of which does not include a surrounding region around a mounting region, in a size that allows determination of whether or not the component 31 is present. Specifically, the controller 9 is configured to determine the mounting determination regions of images for comparing the images before and after mounting of the component in a size that allows determination of whether or not the component 31 is present using the information about the height of the substrate P at the mounting position when determining the mounting determination regions.

More specifically, the controller 9 is configured to determine the mounting determination regions such that another component 31 adjacent to the component 31, the mounting state of which is to be determined, and a substrate feature do not enter the mounting determination regions. The substrate feature includes a pattern, a silk, an electrode, a solder, etc., for example.

The controller 9 is also configured to determine the mounting determination regions based on the suction position of the component 31 imaged by a component recognition imaging section 7 in addition to the height of the substrate P at the mounting position. Specifically, the controller 9 adjusts the mounting determination regions based on the deviation of the suction position of the component 31 with respect to a corresponding nozzle 41. In addition, the controller 9 is configured to acquire the height of the mounting position on the substrate P using the image of the mounting position before mounting of the component 31 for determining the mounting state. Specifically, the controller 9 captures, by the two cameras 81, the image to be captured before or after mounting of the component 31, and uses the image to acquire the height of the mounting position. Furthermore, the controller 9 makes a mounting determination using at least one of the images captured by the two cameras 81.

Control Processing During Suction Operation

Control processing during suction operation performed by the controller 9 of the component mounting device 100 is now described based on a flowchart with reference to FIG. 6.

In a step S1, the component 31 at a feed position is imaged by the imaging unit 8 during downward movement of the mounting head 42 (nozzle 41). In a step S2, when the mounting head 42 (nozzle 41) reaches a descending end, the component 31 is imaged by the imaging unit 8. That is, when the component 31 is suctioned by the mounting head 42 (nozzle 41), imaging is performed. In a step S3, the feed position of the component 31 is imaged by the imaging unit 8 during upward movement of the mounting head 42 (nozzle 41). That is, when the component 31 has been normally suctioned by the mounting head 42 (the nozzle 41), an image in which the target component 31 is not at the feed position is captured.

In a step S4, component recognition is performed based on the captured images. In a step S5, it is determined whether or not component recognition has been successful. When component recognition has been successful, the control processing during suction operation is terminated. When component recognition has been unsuccessful, on the other hand, the controller 9 advances to a step S6, and stops operation due to an error. In a step S7, the images captured during the downward movement, at the descending end, and during the upward movement are output. Thereafter, the control processing during suction operation is terminated. When the suction operation of another mounting head (nozzle 41) is continued, the processing in the steps S1 to S7 is repeated.

Control Processing During Mounting Operation

Control processing during mounting operation performed by the controller 9 of the component mounting device 100 is now described based on a flowchart with reference to FIG. 7.

In a step S11, the component 31 suctioned by the mounting head 42 (nozzle 41) is recognized based on the image captured by the component recognition imaging section 7. In a step S12, correction data of the mounting determination regions (detection frames) is acquired based on the recognition result of the component 31. That is, correction data for adjusting the mounting determination regions is acquired based on the deviation of the suction position of the component 31 with respect to the nozzle 41.

In a step S13, the mounting position on the substrate P is imaged by the imaging unit 8 during downward movement of the mounting head 42 (nozzle 41). That is, images in which the target component 31 is not mounted at the mounting position on the substrate P are captured. In a step S14, stereo matching is performed based on the captured images, and the height of the mounting position on the substrate P is measured. In a step S15, the mounting position on the substrate P is imaged by the imaging unit 8 during upward movement of the mounting head 42 (nozzle 41). That is, when the component 31 has been normally mounted, an image in which the target component 31 is mounted at the mounting position on the substrate P is imaged.

In a step S16, superposition alignment between the image captured during the downward movement (before mounting of the component 31) and the image captured during the upward movement (after mounting of the component 31) is performed. In a step S17, positional correction of the mounting determination regions (detection frames) for the component recognition result is performed. Then, in a step S18, positional correction of the mounting determination regions (detection frames) for the height measurement result is performed. Thus, the mounting determination regions (detection frames) are set on the images in which the target component 31 supposedly appears.

In a step S19, the difference image in the mounting determination regions (detection frames) is generated. That is, an image is generated due to a difference between the mounting determination region of the image captured during the downward movement (before mounting of the component 31) and the mounting determination region of the image captured during upward movement (after mounting of the component 31). In a step S20, a mounting OK/NG determination (mounting determination) is made based on the generated difference image. That is, when there is the target component 31 at a predetermined position in the difference image, a mounting OK determination is made (it is determined that the component 31 has been normally mounted). When there is no target component 31 at the predetermined position in the difference image, on the other hand, a mounting NG determination is made (it is determined that the component 31 has not been normally mounted).

In a step S21, it is determined whether or not the component 31 has been successfully mounted (whether or not the component 31 has been normally mounted). When the component 31 has been successfully mounted, the control processing during mounting operation is terminated. When the component 31 has been unsuccessfully mounted, on the other hand, the controller 9 advances to a step S22, and stops operation due to an error. In a step S23, the images captured during the downward movement and during the upward movement are output. Thereafter, the control processing during mounting operation is terminated. When mounting by another mounting head 42 (nozzle 41) is continued, the processing in the steps S11 to S23 is repeated.

Effects of Embodiment

According to this embodiment, the following effects can be obtained.

According to this embodiment, as hereinabove described, the component mounting device 100 is provided with the controller 9 that determines the mounting state by comparing the images before and after mounting of the component 31 during operation from completion of mounting of the component 31 to completion of mounting of the subsequent component 31. Thus, the mounting state of a precedent component 31 can be determined before completion of mounting of the subsequent component 31, and hence defective mounting of the component 31 on the substrate P can be immediately detected. Consequently, unlike the case where all of the components 31 are mounted on the substrate P, and thereafter the mounting state is determined, a mounting loss of the component 31 due to mounting of the plurality of components 31 on the substrate P before detection of defective mounting can be significantly reduced or prevented.

According to this embodiment, the imaging unit 8 is configured to capture the image before mounting of the component 31 when the mounting head 42 moves down to the mounting position on the substrate P before mounting the component 31 and capture the image after mounting of the component 31 when the mounting head 42 moves up from the mounting position on the substrate P after mounting the component 31. Furthermore, the controller 9 is configured to determine the mounting state by comparing the image before mounting and the image after mounting. Thus, the image before mounting and the image after mounting captured immediately before and immediately after mounting are compared, and hence it is not necessary to provide a storage for storing image data on the mounting positions of the plurality of components 31. Furthermore, an image is captured during downward movement of the mounting head 42 and during upward movement of the mounting head 42, and hence it is possible to prevent the time separately and additionally required for imaging operation as compared with the case where the downward/upward movement of the mounting head 42 and the imaging operation are separately performed.

According to this embodiment, the controller 9 is configured to acquire the information about the height of the substrate P at the mounting position from the time point at which the mounting head 42 reaches the mounting position on the substrate P after suctioning the component 31 to the time point at which the mounting head 42 completes upward movement from the mounting position on the substrate P after mounting the component 31, and to determine the mounting state by comparing the images before and after mounting of the component 31 using the acquired information about the height of the substrate P at the mounting position. Thus, the position of the component 31 at the mounting position in the image can be accurately acquired based on the information about the actual height of the mounting position of the component 31. Consequently, the mounting state of the component 31 on the substrate P can be accurately determined. Furthermore, the information about the height of the substrate P at the mounting position is acquired before completion of upward movement of the mounting head 42 such that the information about the height of the substrate P can be acquired while a loss of time is significantly reduced or prevented.

According to this embodiment, the controller 9 is configured to acquire the information about the height of the substrate P at the mounting position using at least one of the images of the mounting position before and after mounting of the component 31 for determining the mounting state. Thus, the actual height of the mounting position of the component 31 can be accurately acquired based on at least one of the images before and after mounting of the component 31.

According to this embodiment, the imaging unit 8 is configured to be capable of capturing an image from the plurality of directions. Thus, the actual height of the mounting position of the component 31 can be easily and accurately acquired based on the image captured from the plurality of directions.

According to this embodiment, the imaging unit 8 includes the plurality of cameras 81. Thus, the mounting position on the substrate P can be easily imaged from the plurality of directions by the plurality of cameras 81.

According to this embodiment, the controller 9 is configured to determine the mounting determination regions of images for comparing the images before and after mounting of the component 31 in a size that allows determination of whether or not the component 31 is present using the information about the height of the substrate P at the mounting position when determining the mounting determination regions. Thus, the mounting determination regions can be narrowed down to small regions based on the actual height of the mounting position of the component 31, and hence erroneous determination due to noise such as blowing away of a surrounding component can be significantly reduced or prevented. Consequently, the mounting state of the component 31 on the substrate P can be accurately determined.

According to this embodiment, the controller 9 is configured to determine the mounting determination regions such that another component 31 adjacent to the component 31, the mounting state of which is to be determined, and the substrate feature do not enter the mounting determination regions. Thus, erroneous determination due to the influence of another component 31 adjacent to the target component 31 and the substrate feature can be significantly reduced or prevented, and hence a mounting determination for the component 31 on the substrate P can be more accurately made.

According to this embodiment, the component mounting device 100 is provided with the component recognition imaging section 7 that images the suction state of the component 31 suctioned by the mounting head 42, and the controller 9 is configured to determine the mounting determination regions based on the suction position of the component 31 imaged by the component recognition imaging section 7 in addition to the height of the substrate P at the mounting position. Thus, the mounting determination regions can be determined based on the suction position of the component 31 in addition to the height of the substrate P at the mounting position, and hence the accuracy of mounting determination for the component 31 on the substrate P can be further increased.

Modifications

The embodiment disclosed this time must be considered as illustrative in all points and not restrictive. The range of the present disclosure is shown not by the above description of the embodiment but by the scope of claims for patent, and all modifications within the meaning and range equivalent to the scope of claims for patent are further included.

For example, while the example in which the imaging unit includes the plurality of cameras, and can image the mounting position from the plurality of directions has been shown in the aforementioned embodiment, the present disclosure is not restricted to this. According to the present disclosure, as in a modification shown in FIG. 8, an imaging unit 8a may include a camera 81a, illuminators 82, and optical systems 83. In this case, the field of view of the single camera 81a may be divided by the optical systems 83 including lenses and mirrors, and a mounting position may be capable of being imaged from a plurality of directions.

Alternatively, one camera may capture an image while moving such that a mounting position is imaged from a plurality of directions.

While the example in which the controller is configured to perform control of capturing an image when the mounting head moves down to the mounting position on the substrate before mounting the component and control of capturing an image when the mounting head moves up from the mounting position on the substrate after mounting the component has been shown in the aforementioned embodiment, the present disclosure is not restricted to this. According to the present disclosure, the controller may be configured to perform at least one of control of capturing an image when the mounting head moves down to the mounting position on the substrate before mounting the component and control of capturing an image when the mounting head moves up from the mounting position on the substrate after mounting the component.

While the example in which the height of the mounting position is measured before image capturing during upward movement of the mounting head has been shown in the aforementioned embodiment, the present disclosure is not restricted to this. According to the present disclosure, the height of the mounting position may be measured after image capturing during upward movement of the mounting head.

While the example in which the height of the substrate at the mounting position of the component is acquired based on the imaging result of the imaging unit (imaging section) has been shown in the aforementioned embodiment, the present disclosure is not restricted to this. According to the present disclosure, the height of the substrate at the mounting position of the component may be acquired based on a displacement sensor or a distance sensor. In this case, the displacement sensor or the distance sensor may be provided on the mounting head or in the vicinity of the mounting head.

While the example in which the controller is configured to determine whether or not the component has been normally mounted based on the difference image between the image of the mounting position before mounting of the component and the image of the mounting position after mounting of the component has been shown in the aforementioned embodiment, the present disclosure is not restricted to this. According to the present disclosure, the image of the mounting position before mounting of the component and the image of the mounting position after mounting of the component may be correlated to each other to compare the images before and after mounting.

While the processing performed by the controller is described, using the flow described in a flow-driven manner in which processing is performed in order along a processing flow for the convenience of illustration in the aforementioned embodiment, the present disclosure is not restricted to this. According to the present disclosure, the processing performed by the controller may be performed in an event-driven manner in which processing is performed on an event basis. In this case, the processing may be performed in a complete event-driven manner or in a combination of an event-driven manner and a flow-driven manner.

The invention claimed is:

1. A component mounting device comprising:
a mounting head that mounts a component at a mounting position on a substrate;
an imaging device capable of imaging the mounting position on the substrate; and
a controller that determines a mounting state by comparing images of the mounting position before and after mounting of the component captured by the imaging device, wherein
the controller is configured to determine the mounting state by comparing the images before and after mounting of the component during operation from completion of mounting of the component to completion of mounting of a subsequent component, and
the component mounting device further comprising a suction state imaging device that images a suction state of the component suctioned by the mounting head, wherein
the controller is configured to determine detection frames in a range smaller than the captured image in the captured image of images for comparing the images before and after mounting of the component based on a suction position of the component relative to the mounting head imaged by the suction state imaging device in addition to the height of the substrate at the mounting position.

2. The component mounting device according to claim 1, wherein
the imaging device captures the image before mounting of the component when the mounting head moves down to the mounting position on the substrate before mounting the component and captures the image after mounting of the component when the mounting head moves up from the mounting position on the substrate after mounting the component, and
the controller determines the mounting state by comparing the image before mounting and the image after mounting.

3. The component mounting device according to claim 1, wherein
the controller is configured to acquire the information about the height of the substrate at the mounting position using at least one of the images of the mounting position before and after mounting of the component for determining the mounting state.

4. The component mounting device according to claim 3, wherein
the imaging device is configured to be capable of capturing an image from a plurality of directions.

5. The component mounting device according to claim 4, wherein
the imaging device includes a plurality of cameras, or a single camera and an optical system that divides a field of view of the single camera.

6. The component mounting device according to claim 1, wherein
the controller is configured to determine the mounting determination regions of images for comparing the images before and after mounting of the component in a size that allows determination of whether or not the component is present using the information about the height of the substrate at the mounting position when determining the mounting determination regions.

7. The component mounting device according to claim 6, wherein
the controller is configured to determine the mounting determination regions such that another component adjacent to the component, the mounting state of which is to be determined, and a substrate feature do not enter the mounting determination regions.

8. A component mounting method comprising:
mounting a component at a mounting position on a substrate;
imaging the mounting position on the substrate before mounting of the component;
imaging the mounting position on the substrate after mounting of the component; and
determining a mounting state by comparing captured images of the mounting position before and after mounting of the component during operation from completion of mounting of the component to completion of mounting of a subsequent component, wherein
the determining of the mounting state includes determining detection frames in a range smaller than the captured image in the captured image of images for comparing the images before and after mounting of the component based on a suction position of the component relative to the mounting head imaged by a suction state imaging device that images a suction state of the component suctioned by the mounting head in addition to the height of the substrate at the mounting position.

* * * * *